United States Patent
Droegeler et al.

(10) Patent No.: US 11,920,753 B2
(45) Date of Patent: Mar. 5, 2024

(54) LED MODULE WITH THERMAL INSULATION TOWARDS OPTICAL COMPONENT AND VEHICLE HEADLIGHT WITH SUCH LED MODULE

(71) Applicant: LUMILEDS LLC, San Jose, CA (US)

(72) Inventors: Marc Droegeler, Aachen (DE); Wim Boogaard, Oostkapelle (NL)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 17/954,053

(22) Filed: Sep. 27, 2022

(65) Prior Publication Data

US 2023/0101602 A1   Mar. 30, 2023

Related U.S. Application Data

(60) Provisional application No. 63/248,785, filed on Sep. 27, 2021.

(51) Int. Cl.
```
F21S 41/29        (2018.01)
F21S 41/141       (2018.01)
F21S 45/47        (2018.01)
```
(52) U.S. Cl.
CPC ........... *F21S 41/29* (2018.01); *F21S 41/141* (2018.01); *F21S 45/47* (2018.01)

(58) Field of Classification Search
CPC .......... F21S 45/47; F21S 45/49; F21S 41/141; F21S 41/39; F21Y 2115/10; F21V 29/15
See application file for complete search history.

(56) References Cited

U.S. PATENT DOCUMENTS

| | | | |
|---|---|---|---|
| 6,827,470 B2 | 12/2004 | Sagal et al. | |
| 8,523,410 B2* | 9/2013 | Hashimoto | F21V 3/062 362/373 |
| 8,545,047 B2 | 10/2013 | Yip et al. | |
| 8,740,415 B2 | 6/2014 | Wheelock | |
| 8,884,517 B1 | 11/2014 | Shum et al. | |
| 9,791,141 B2* | 10/2017 | Creusen | F21V 29/505 |
| 2006/0180824 A1 | 8/2006 | Kim et al. | |
| 2008/0203897 A1 | 8/2008 | De Samber et al. | |
| 2018/0283647 A1* | 10/2018 | Hemon | F21V 29/503 |

FOREIGN PATENT DOCUMENTS

| | | |
|---|---|---|
| EP | 2280428 A1 | 2/2011 |
| KR | 101240328 B1 | 4/2012 |

OTHER PUBLICATIONS

International Search Report and Written Opinion dated Jan. 16, 2023 for PCT International Application No. PCT/US22/44902.

* cited by examiner

*Primary Examiner* — Robert J May
(74) *Attorney, Agent, or Firm* — Volpe Koenig

(57) ABSTRACT

A light-emitting device (LED) module is described. The LED module includes a heatsink, at least one LED on a top surface of the heatsink, and mounting features protruding from the top surface of the heat sink for alignment with an optical component. A thermally insulating material is adjacent at least portions of the mounting features that would otherwise be in contact with the optical component when mounted.

15 Claims, 8 Drawing Sheets

LED MODULE WITH THERMAL INSULATION TOWARDS OPTICAL COMPONENT AND VEHICLE HEADLIGHT WITH SUCH LED MODULE

CROSS REFERENCE TO RELATED APPLICATIONS

This application claims the benefit of U.S. Provisional Patent Application No. 63/248,785, which was filed on Sep. 27, 2021, the contents of which are hereby incorporated by reference herein.

BACKGROUND

Light emitting diodes (LEDs), which may encompass any or all semiconductor light emitting devices including, for example, diode lasers, more and more replace older technology light sources due to superior technical properties, such as energy efficiency and lifetime. This is true even for demanding applications, for example in terms of luminance, luminosity, and/or beam shaping, such as vehicle headlighting. However, despite their energy efficiency, LEDs, and especially high power ones, may still develop considerable heat, which requires cooling, typically by connecting the LED to a heatsink, to keep LED junction temperatures low. Such need for heat sinking LEDs may be shared with many other high-power semiconductor components.

SUMMARY

A light-emitting device (LED) module is described. The LED module includes a heatsink, at least one LED on a top surface of the heatsink, and mounting features protruding from the top surface of the heat sink for alignment with an optical component. A thermally insulating material is adjacent at least portions of the mounting features that would otherwise be in contact with the optical component when mounted.

BRIEF DESCRIPTION OF THE DRAWINGS

A more detailed understanding can be had from the following description, given by way of example in conjunction with the accompanying drawings wherein.

DETAILED DESCRIPTION

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present disclosure. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures, unless explicitly stated otherwise. It will be understood that these terms are intended to encompass different orientations of the device in addition to the orientation depicted in the figures.

As mentioned above, LEDs may still develop considerable waste heat that needs to be dissipated to their environment. For such purposes, a heatsink is conventionally attached to the LEDs. Other structures, such as the primary optical components close to the LEDs, and/or the primary optical components close to the LEDs, may also be used for heat dissipation.

Figure 1:
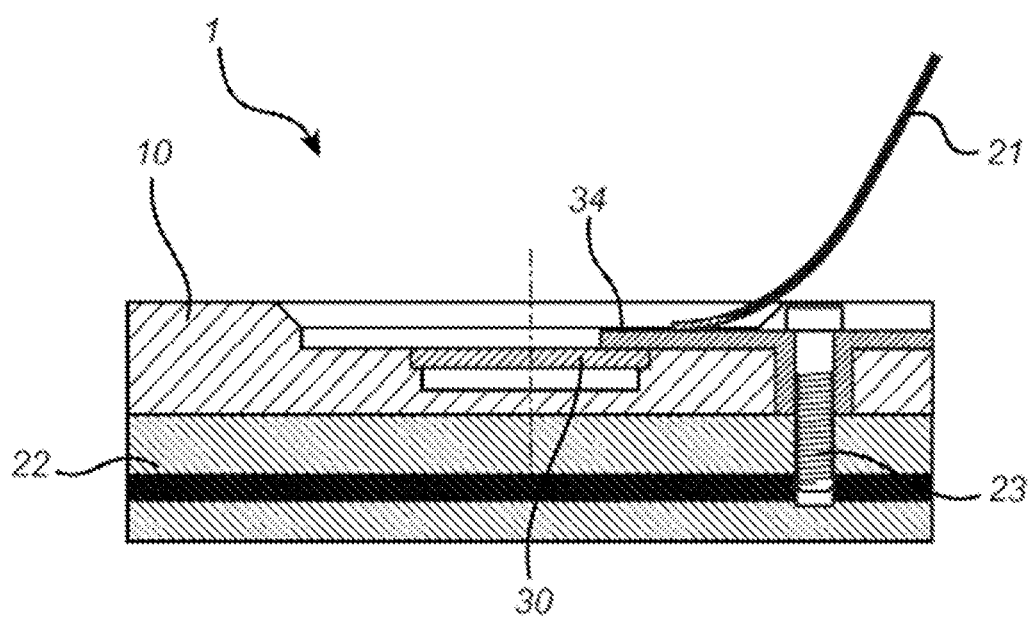
FIG. 1 is a cross-sectional view of an LED module.

FIG. 1 is a cross-sectional view of an LED module. As mentioned in U.S. Pat. No. 9,791,141, which is hereby incorporated by reference into this disclosure, a remote phosphor element 30, as shown in FIG. 1, may serve as light source. For heat dissipation, a first heat path may be established from the phosphor element 30 to a heatsink 22 via a heat conducting part 34 of a cover 10 and a heat conducting screw 23. A second heat path may transfer heat from the phosphor element 30 into the base of a reflector 21 via a heat conducting part 34. In this example, the reflector 21 may be used, in addition to the heatsink 22, to dissipate heat to the environment of the LED module 1.

While the primary optical component of reflector 21 may offer further heat dissipation means, doing so does not come without drawbacks. For example, with reflector 21 being close to the heat generating component (e.g., the phosphor element 30 in FIG. 1), in order to be used that way, the reflector 21 needs to be able to withstand high temperatures. Additionally, to serve as a heat sink, the reflector 21 may need to be manufactured out of a material with high thermal conductivity. Such materials that can withstand high temperatures and/or have high thermal conductivity typically are expensive and/or limit design freedom. For example, the reflector 21 may need to be formed out of metal or out of special plastics. Metal forming manufacturing processes may be expensive and special plastics may be expensive and/or require special molding processes.

Unfortunately, such raised requirements for the optical components close to the LEDs arise also if no particular heat conducting parts 34 are used. Elevated temperatures for such optical components simply arise because of their closeness to the LEDs generating considerable heat during operation. Such elevated temperatures, for high power LED light sources, at the optical component processing the light emitted by the LEDs, easily can reach up to 135° C. or more.

Figure 2:
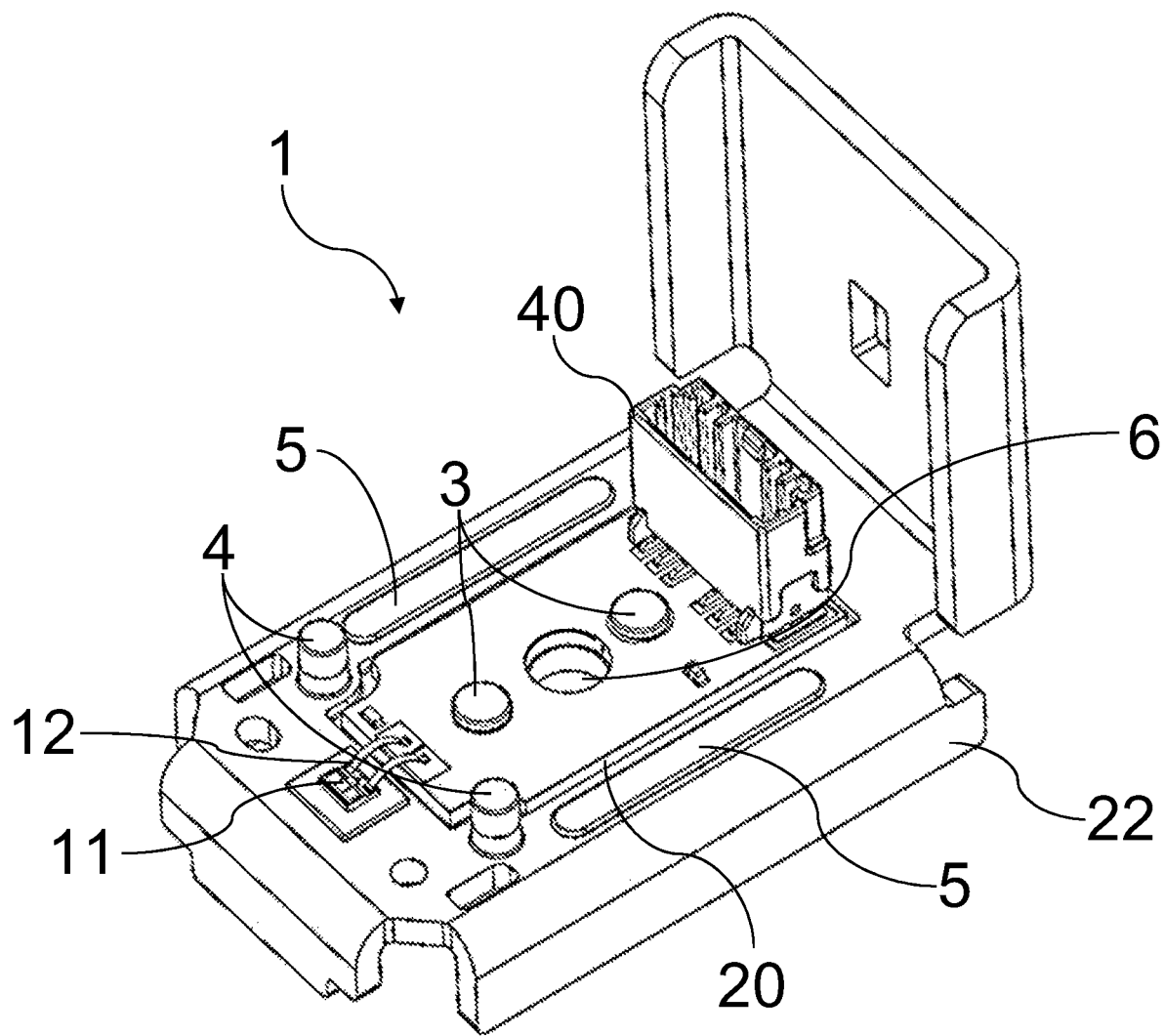
FIG. 2 is a schematic perspective view of another LED module.

FIG. 2 is a schematic perspective view of another LED module. In the example illustrated in FIG. 2, the LED module 1 includes a heatsink 22, three LEDs 11 electrically connected via ribbon bonds 12 to a PCB 20, and an electrical connector 40 mounted on the PCB 20. In the illustrated example, the heatsink 22 has (in the figure upwards) protruding pins 3, 4, pins 3 serving for fastening the PCB 20 to heatsink 22, and pins 4 serving as, in the heatsink plane, alignment elements for a reflector 21 to be mounted to the heatsink 22 (see FIG. 3). Furthermore, protruding from the heatsink 22 may be elevated stripes 5 for alignment of the reflector 21 transversal to the heatsink plane.

Figure 3:
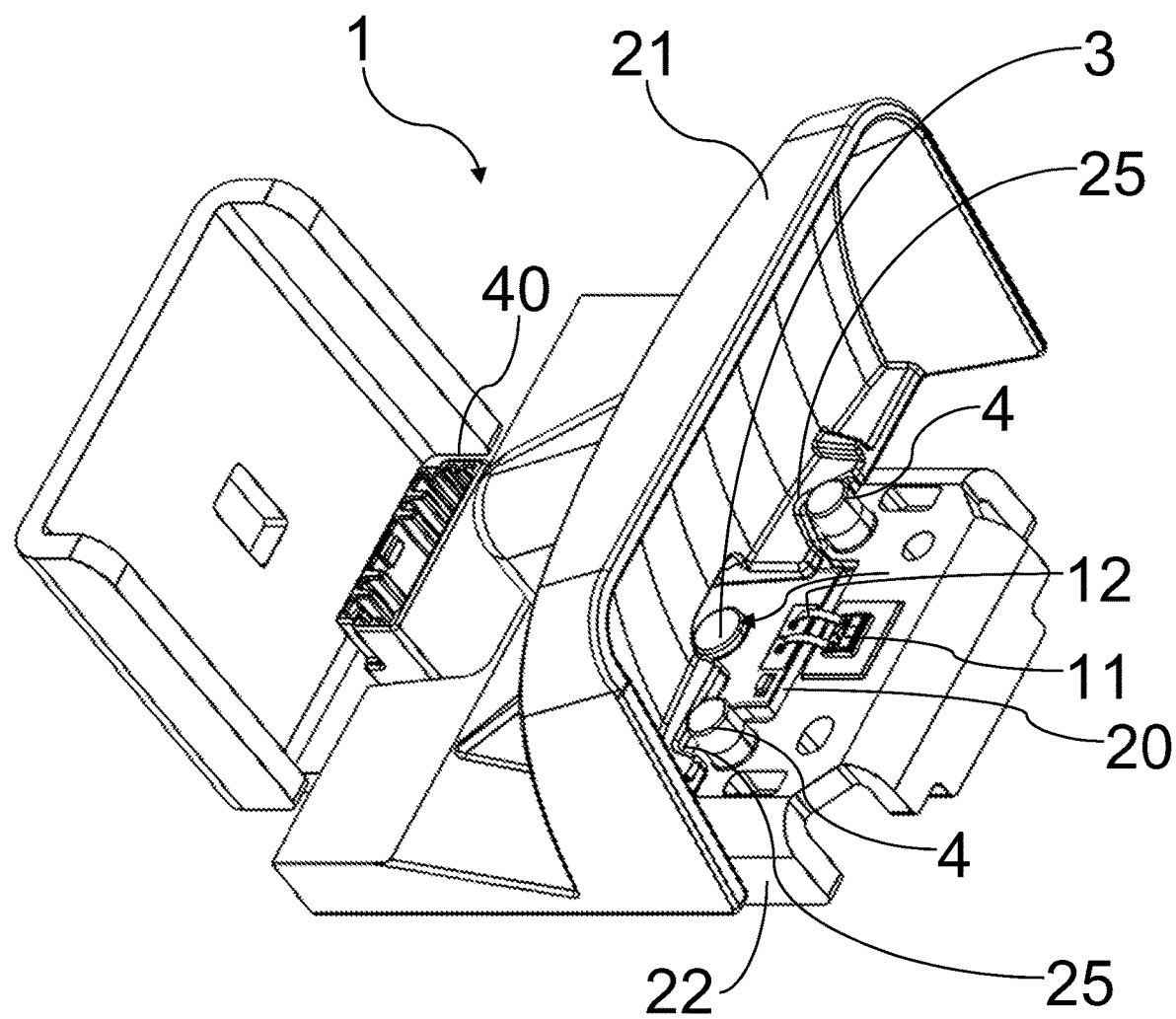
FIG. 3 is another schematic perspective view of the LED module of FIG. 2 with a reflector added to the LED module.

FIG. 3 is another schematic perspective view of the LED module of FIG. 2 with a reflector added to the LED module. In the example illustrated in FIG. 3, the LED module of FIG. 1 is rotated approximately 90° rotated around an axis perpendicular to the heatsink plane and centered thereto with an optical component 21 (a reflector in the illustrated example) mounted to the heatsink 22. The reflector 21 may be mounted by a fastener (see FIG. 4) penetrating the through-hole 6 in the PCB 20 and heatsink 22 (cf. FIG. 1). Carve-outs 25 of reflector 21, in a form-fit manner, may touch the lateral surfaces of pins 4, thereby aligning reflector 21 with respect to the three LEDs 11.

Figure 4:
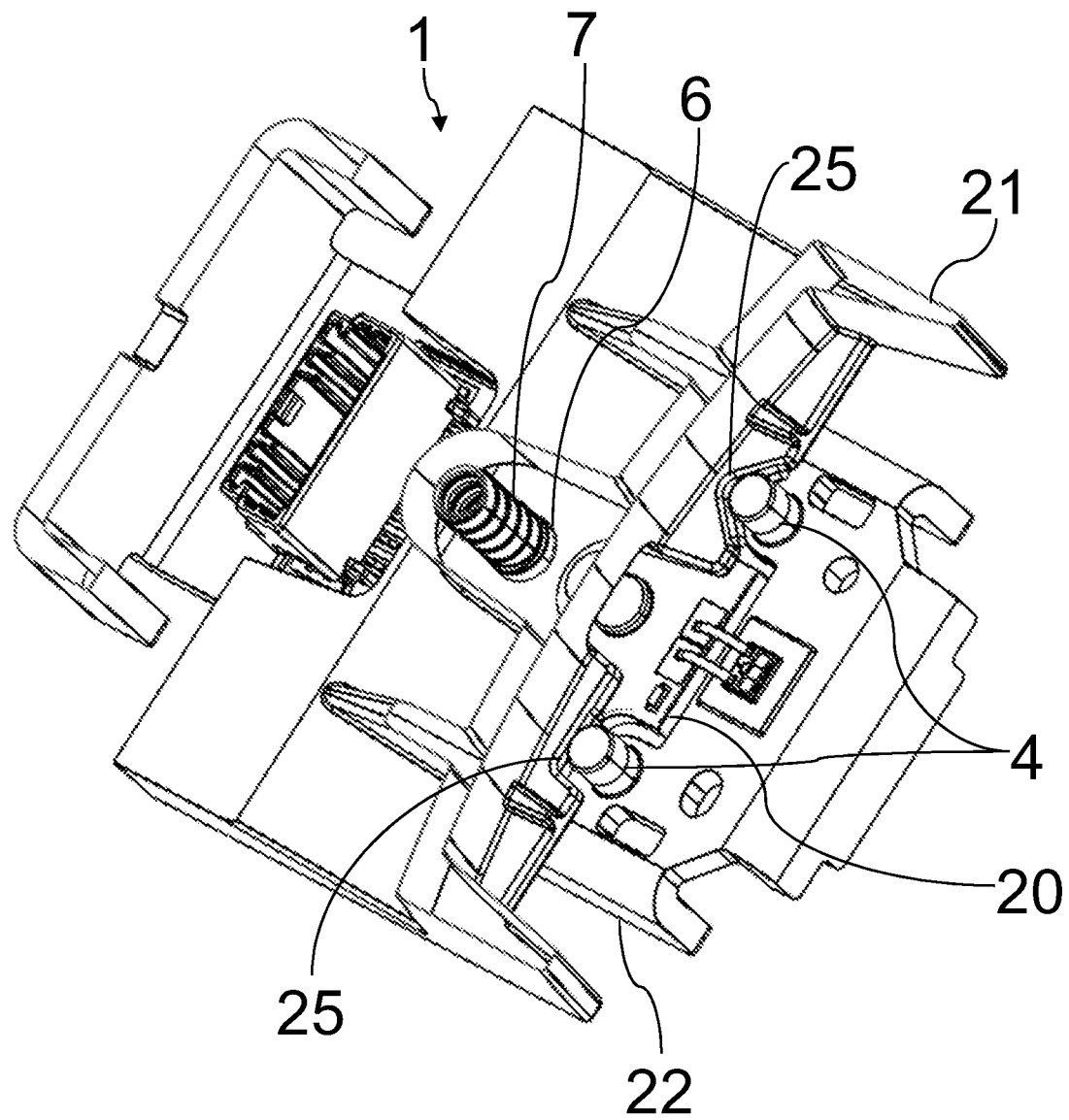
FIG. 4 is a schematic perspective view of the LED module with reflector of FIG. 3 in slightly rotated perspective and with the upper part of the reflector cut away.
Figure 5:
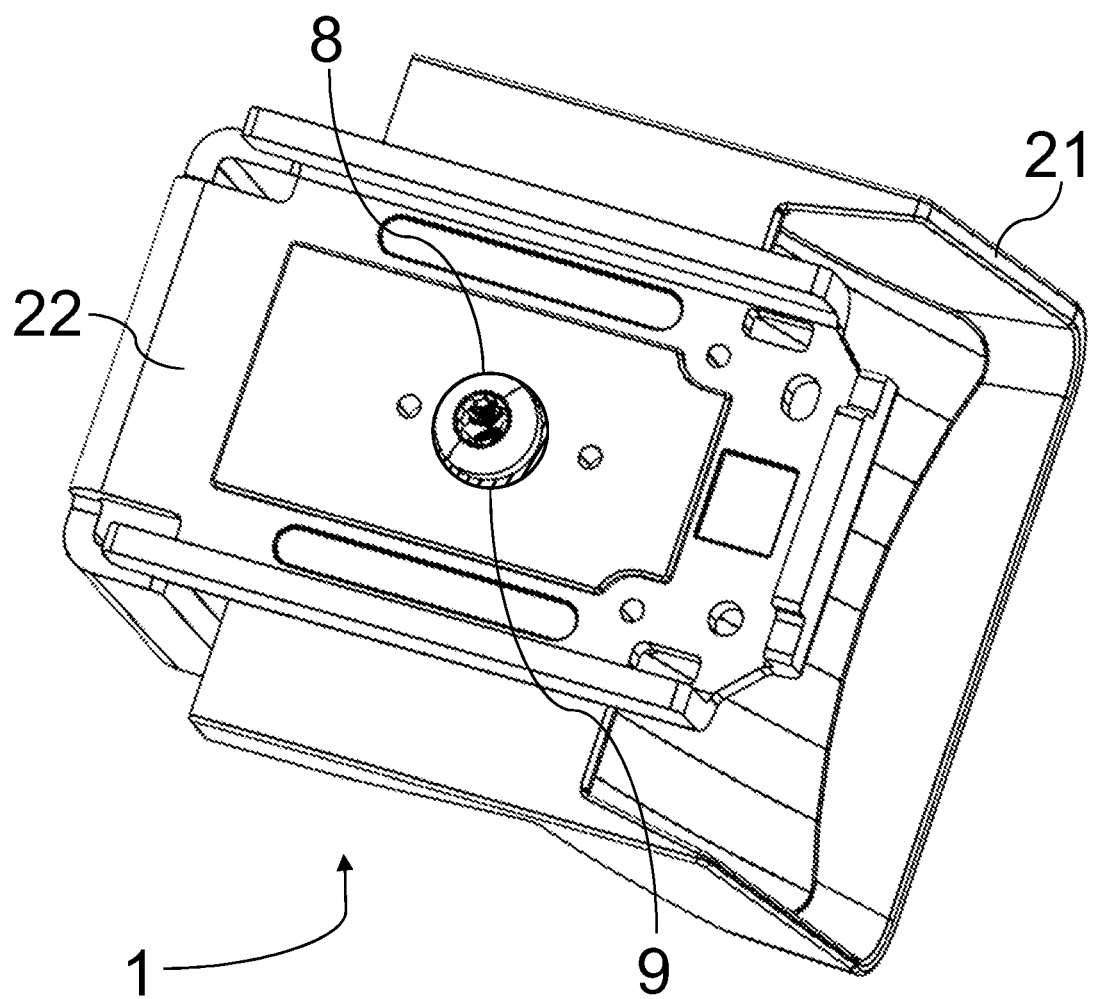
FIG. 5 is a schematic perspective view of the LED module with reflector of FIG. 3 from the backside.

FIG. 4 is a schematic perspective view of the LED module with reflector of FIG. 3 in slightly rotated perspective and with the upper part of the reflector cut away. FIG. 5 is a schematic perspective view of the LED module with reflector of FIG. 3 from the backside. FIGS. 4 and 5 show how the reflector is fixed to the heatsink 22. For doing so, FIG. 4 shows, in schematic perspective view, the LED module of FIG. 3, however, somewhat rotated and, in particular, with the upper part of reflector 21 removed to allow the fastening mechanism of reflector 21 to be visible. Reflector 21, on its inner side, may have a reflector pin 7 penetrating the through-hole 6 (of PCB 20 and heatsink 22). Such pin 7, at its part protruding from the lower side of heatsink 22, may have a thread on which a nut 8 is screwed drawing the reflector towards the upper surface of heatsink 22 until it tightly rests on the elevated stripes 5. The nut 8 as well as a washer 9 (see the hatched area) between the nut 8 and the lower side of heatsink 22 can be seen from FIG. 5 showing the LED module, in schematic perspective view, from its backside.

From FIGS. 2 to 5, it is discernable that the reflector 21 may contact the LED module 1 via the LED module's mounting features for the reflector, such as via the reflector 21 (i) abutting against the lateral surfaces of protruding pins 4 for alignment parallel to the upper surface of heatsink 22 (e.g., for alignment in the heatsink plane)), (ii) resting on the elevated stripes 5 (e.g., for alignment transversal to the heatsink plane), and (iii) nut 8 (on washer 9) being screwed onto reflector pin 8 penetrating the through-hole 8. While FIGS. 2 to 5 show a particular embodiment only, in general, the primary optical component that processes the light of the LEDs of the LED module needs to be mounted to the LED module in close proximity to the LEDs. Such mounting may make use of mounting features of the LED module of which some serve for alignment of the optical component (alignment features) and others serve for fixation of the optical component (fixation or fastening features).

The LEDs 11, on operation of the LED module 1, generate considerable heat, which is distributed over heatsink 22. Accordingly, all parts of heatsink 22 will assume highly elevated temperatures. The optical component 21, which may touch the heatsink in the mounting features 4, 5 (alignment features) and 6, 8, 9 (fixation features), needs to be able to withstand these elevated temperatures. Thus, the optical component 21 is conventionally made from a temperature stable material, and, as explained U.S. Pat. No. 9,791,141 (incorporated by reference above), benefitted from such temperature stable material by using the optical component 21 as a further heat dissipation means in addition to the heatsink 22.

Temperature stable materials, however, are costly, and, with a proper design of the heatsink 22, appropriate placement of the LEDs 11 in relation to the heatsink 22, and potentially further measures, like using a fan, the benefit of using the optical component 21 as an additional heat dissipation component may not pay off for the added cost of temperature stable materials. Embodiments described herein provide for a thermal insulation to the LED module 1 between at least a part of the LED module 1 and at least a part of the optical component 21. For example, while in the conventional LED module, the heat may flow unhindered from the LED module to the optical component, in the embodiments described herein, the thermal insulation will reduce such heat flow.

Adding a thermal insulation at least partly between the LED module and the optical component may reduce the heat coupled into the optical component, which may continue to be cooled by its environment, such as by heat conduction and heat convection to the surrounding air and radiative heat transfer to its environment. Thus, the temperature at the optical component may be reduced, and the optical component may be made of a less temperature stable and, thus, cheaper material. Such thermal insulation can be realized in a variety of ways.

Figure 6:
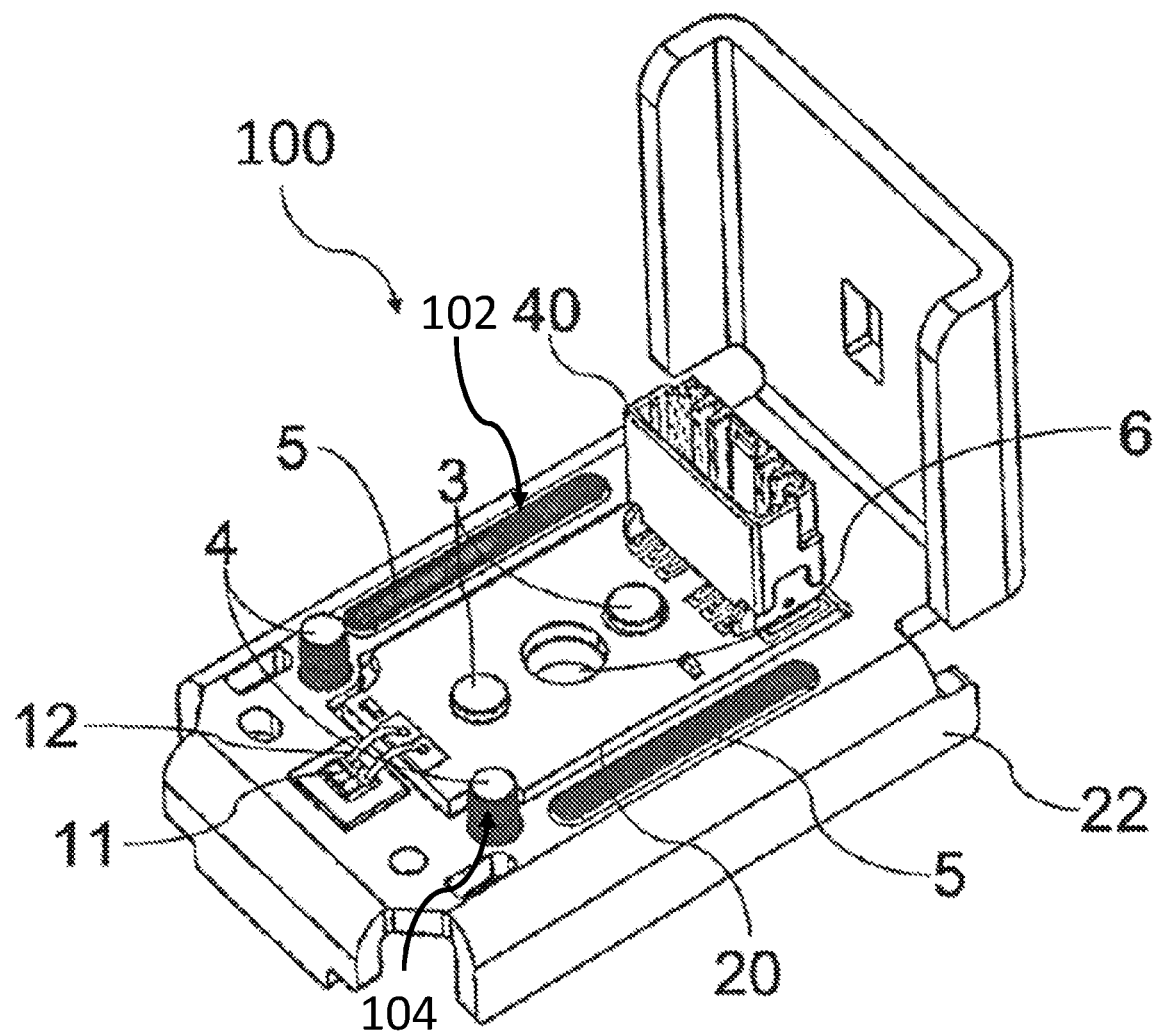
FIG. 6 is a schematic perspective view of an LED module with insulating features.

FIG. 6 is a schematic perspective view of an LED module 100. The LED module 100 is identical to the LED module 1 of FIG. 2 except for the insertion of certain insulating components. For example, a hollow cylinder 104, which may simply be a tube formed from an insulating material, may be slid on the alignment pins 4, which may avoid the reflector 21 (not shown in FIG. 6) from directly touching the lateral faces of the pins 4. Alternatively, or additionally, as shown in FIG. 6, a flat strip 102 of insulating material may be placed between the elevated stripes 5 and the reflector 21 (not shown in FIG. 6). Alternatively or additionally, although not shown in FIG. 6, the LED module 100 may use mounting features that have, at least in parts, a low thermal conductivity, such as by being made of poor thermally conducting plastics. In some embodiments, such poor thermally conducting part may be a separate part added to the LED module on mounting the optical component. Additionally or alternatively, if a washer 9, such as shown in FIG. 5, is used between nut 8 and lower side heatsink 22, such washer 9 may be made of a plastic material having a low thermal conductivity, thus avoiding a direct contact of nut 8, which may consist of a good thermally conducting metal, and the heatsink, which may conduct the heat from the heatsink 22 into the reflector pin 7.

Instead of using a separate part, the mounting features themselves, partly or fully, could be made of low thermal conductivity material. Such might be particularly advantageous by making the alignment features, partly or fully, out of insulating plastics. For so doing, the alignment features, from insulating plastics, may, for example, be molded to the heatsink. The embodiments described herein may also encompass, additionally or alternatively, realizing the alignment features on a separate part, made of insulting plastics, and being fixed to the heatsink (e.g. by screwing, riveting, or gluing).

Besides using thermally badly conducting materials as thermal insulation between at least parts of the LED module and the optical component, such thermal insulation may also be achieved by minimizing the contact area between the LED module and optical component. For example, instead of using cylindrical pins 4 with fitting reflector carve-outs 25, and flat elevated stripes 5 with a flat abutting counterpart of reflector 21, the alignment features can be made with sharp edges, such as in a triangular shape. Alternatively, the contact area between the mounting features and the reflector may be reduced by foreseeing small protrusions on the contact faces of the mounting features reducing the contact to the peaks of the protrusions only. Additionally, choosing a diameter of through-hole 6 sufficiently larger than lateral extension of reflector pin 7 may avoid any contact between heatsink 22 and reflector pin 7 in the penetration area.

Alternatively or additionally, the thermal insulation may be added to the optical component itself. For example, at least some parts of the reflector 21 that contact the mounting features may be made of a poor thermally conducting material and/or may be shaped to minimize the contact area.

Figure 7:
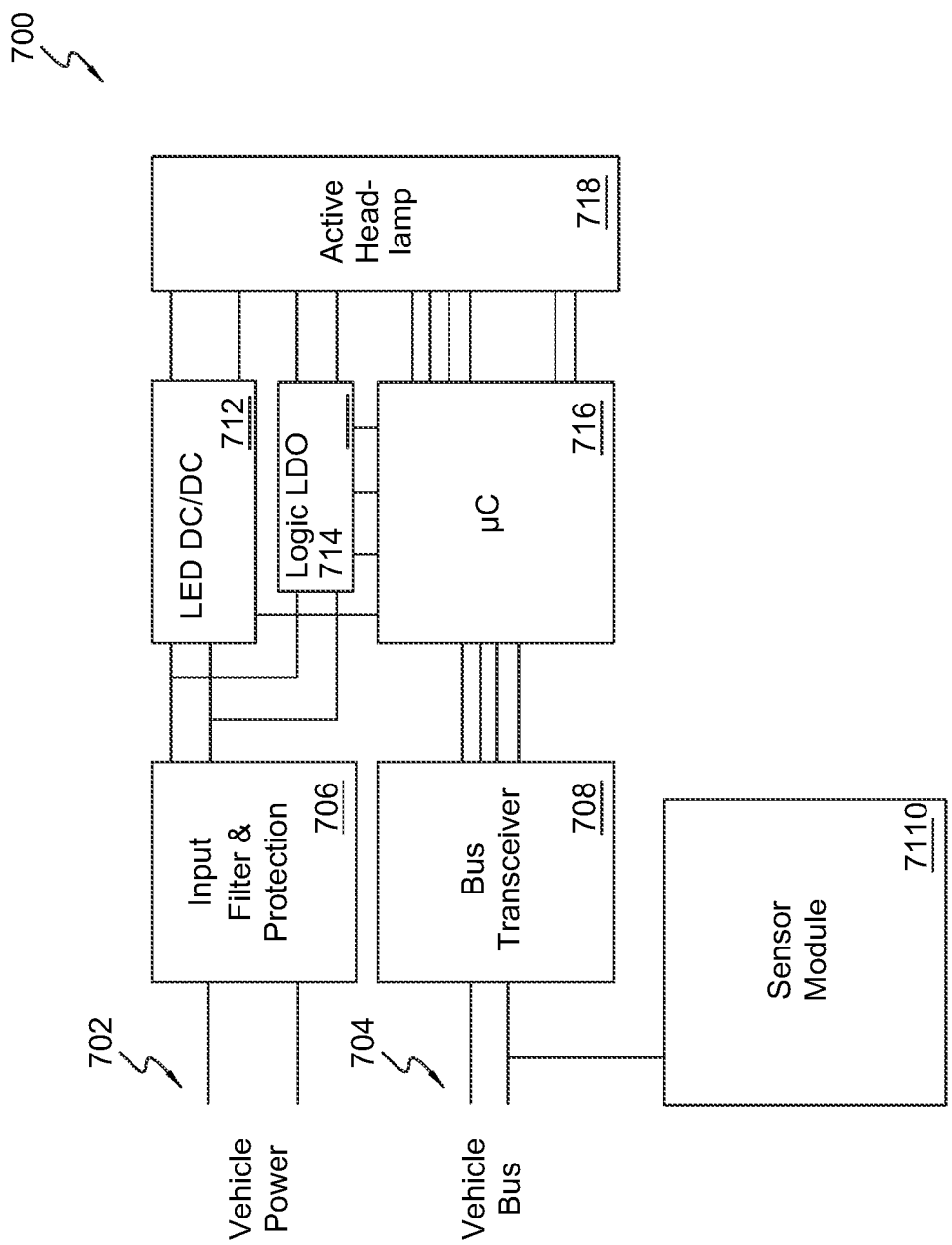
FIG. 7 is a diagram of an example vehicle headlight system.

FIG. 7 is a diagram of an example vehicle headlamp system 700 that may incorporate one or more of the embodiments and examples described herein. The example vehicle headlamp system 700 illustrated in FIG. 7 includes power lines 702, a data bus 704, an input filter and protection module 706, a bus transceiver 708, a sensor module 710, an LED direct current to direct current (DC/DC) module 712, a logic low-dropout (LDO) module 714, a micro-controller 716 and an active head lamp 718.

The power lines 702 may have inputs that receive power from a vehicle, and the data bus 704 may have inputs/outputs over which data may be exchanged between the vehicle and the vehicle headlamp system 700. For example, the vehicle headlamp system 700 may receive instructions from other locations in the vehicle, such as instructions to turn on turn signaling or turn on headlamps, and may send feedback to other locations in the vehicle if desired. The sensor module 710 may be communicatively coupled to the data bus 704 and may provide additional data to the vehicle headlamp system 700 or other locations in the vehicle related to, for example, environmental conditions (e.g., time of day, rain, fog, or ambient light levels), vehicle state (e.g., parked, in-motion, speed of motion, or direction of motion), and presence/position of other objects (e.g., vehicles or pedestrians). A headlamp controller that is separate from any vehicle controller communicatively coupled to the vehicle data bus may also be included in the vehicle headlamp system 700. In FIG. 7, the headlamp controller may be a micro-controller, such as micro-controller (pc) 716. The micro-controller 716 may be communicatively coupled to the data bus 704.

The input filter and protection module 706 may be electrically coupled to the power lines 702 and may, for example, support various filters to reduce conducted emissions and provide power immunity. Additionally, the input filter and protection module 706 may provide electrostatic discharge (ESD) protection, load-dump protection, alternator field decay protection, and/or reverse polarity protection.

The LED DC/DC module 712 may be coupled between the input filter and protection module 106 and the active headlamp 718 to receive filtered power and provide a drive current to power LEDs in the LED array in the active headlamp 718. The LED DC/DC module 712 may have an input voltage between 7 and 18 volts with a nominal voltage of approximately 13.2 volts and an output voltage that may be slightly higher (e.g., 0.3 volts) than a maximum voltage for the LED array (e.g., as determined by factor or local calibration and operating condition adjustments due to load, temperature or other factors).

The logic LDO module 714 may be coupled to the input filter and protection module 706 to receive the filtered power. The logic LDO module 714 may also be coupled to the micro-controller 716 and the active headlamp 718 to provide power to the micro-controller 716 and/or electronics in the active headlamp 718, such as CMOS logic.

The bus transceiver 708 may have, for example, a universal asynchronous receiver transmitter (UART) or serial peripheral interface (SPI) interface and may be coupled to the micro-controller 716. The micro-controller 716 may translate vehicle input based on, or including, data from the sensor module 710. The translated vehicle input may include a video signal that is transferrable to an image buffer in the active headlamp 718. In addition, the micro-controller 716 may load default image frames and test for open/short pixels during startup. In embodiments, an SPI interface may load an image buffer in CMOS. Image frames may be full frame, differential or partial frames. Other features of micro-controller 716 may include control interface monitoring of CMOS status, including die temperature, as well as logic LDO output. In embodiments, LED DC/DC output may be dynamically controlled to minimize headroom. In addition to providing image frame data, other headlamp functions, such as complementary use in conjunction with side marker or turn signal lights, and/or activation of daytime running lights, may also be controlled.

Figure 8:
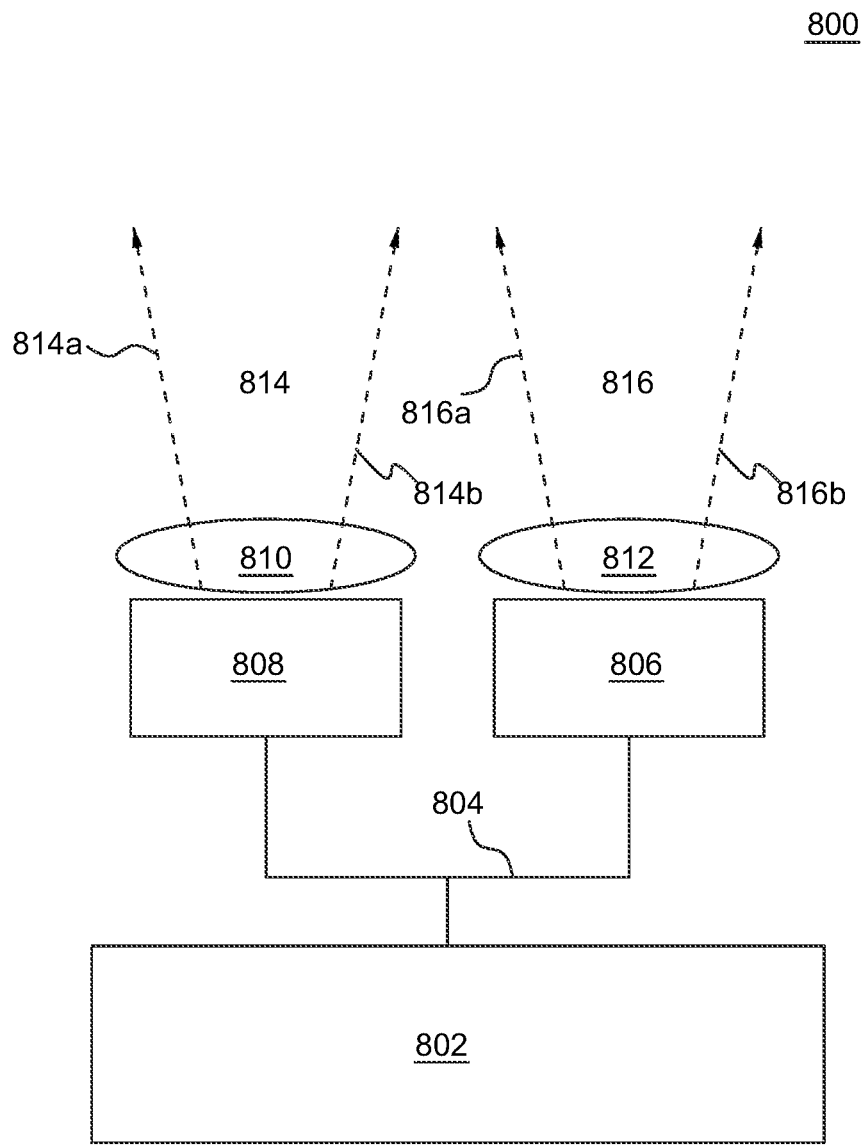
FIG. 8 is a diagram of another example vehicle headlight system.

FIG. 8 is a diagram of another example vehicle headlamp system 800. The example vehicle headlamp system 800 illustrated in FIG. 8 includes an application platform 802, two LED lighting systems 806 and 808, and secondary optics 810 and 812.

The LED lighting system 808 may emit light beams 814 (shown between arrows 814a and 814b in FIG. 8). The LED lighting system 806 may emit light beams 816 (shown between arrows 816a and 816b in FIG. 8). In the embodiment shown in FIG. 8, a secondary optic 810 is adjacent the LED lighting system 808, and the light emitted from the LED lighting system 808 passes through the secondary optic 810. Similarly, a secondary optic 812 is adjacent the LED lighting system 806, and the light emitted from the LED lighting system 806 passes through the secondary optic 812. In alternative embodiments, no secondary optics 810/812 are provided in the vehicle headlamp system.

Where included, the secondary optics 810/812 may be or include one or more light guides. The one or more light guides may be edge lit or may have an interior opening that defines an interior edge of the light guide. LED lighting systems 808 and 806 may be inserted in the interior openings of the one or more light guides such that they inject light into the interior edge (interior opening light guide) or exterior edge (edge lit light guide) of the one or more light guides. In embodiments, the one or more light guides may shape the light emitted by the LED lighting systems 808 and 806 in a desired manner, such as, for example, with a gradient, a chamfered distribution, a narrow distribution, a wide distribution, or an angular distribution.

The application platform 802 may provide power and/or data to the LED lighting systems 806 and/or 808 via lines 804, which may include one or more or a portion of the power lines 702 and the data bus 704 of FIG. 7. One or more sensors (which may be the sensors in the vehicle headlamp system 800 or other additional sensors) may be internal or external to the housing of the application platform 802. Alternatively, or in addition, as shown in the example vehicle headlamp system 700 of FIG. 7, each LED lighting system 808 and 806 may include its own sensor module, connectivity and control module, power module, and/or LED array.

In embodiments, the vehicle headlamp system 800 may represent an automobile with steerable light beams where LEDs may be selectively activated to provide steerable light. For example, an array of LEDs or emitters may be used to define or project a shape or pattern or illuminate only selected sections of a roadway. In an example embodiment, infrared cameras or detector pixels within LED lighting systems 806 and 808 may be sensors (e.g., similar to sensors in the sensor module 710 of FIG. 7) that identify portions of a scene (e.g., roadway or pedestrian crossing) that require illumination.

As would be apparent to one skilled in the relevant art, based on the description herein, embodiments of the present invention can be designed in software using a hardware description language (HDL) such as, for example, Verilog or VHDL. The HDL-design can model the behavior of an electronic system, where the design can be synthesized and ultimately fabricated into a hardware device. In addition, the HDL-design can be stored in a computer product and loaded into a computer system prior to hardware manufacture.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A light-emitting device (LED) module comprising:
a heatsink comprising a top surface and a plurality of mounting features protruding from the top surface, wherein the heatsink and the plurality of mounting features are formed from the same heat conductive material, and wherein the plurality of mounting features are configured for alignment with an optical component;
at least one LED on the top surface of the heatsink; and
a thermally insulating material between the optical component and at least portions of the plurality of mounting features that would otherwise be in contact with the optical component when mounted.

2. The LED module according to claim 1, wherein the thermally insulating material is a part separate from other parts of the plurality of mounting features.

3. The LED module according to claim 2, wherein:
the plurality of mounting features comprise fixation features, and
the thermally insulating material that is a part separate from the other parts of the plurality of mounting features is a washer made of thermally insulating plastics and comprised by the fixation features.

4. The LED module according to claim 2, wherein the thermally insulating material is a tube fitted around the plurality of mounting features.

5. The LED module according to claim 1, wherein the thermally insulating material comprises at least one thermally insulating plastic.

6. The LED module according to claim 1, further comprising the optical component, wherein the thermally insulating material is disposed on the optical component.

7. The LED module according to claim 1, wherein the thermally insulating material is disposed on at least one of the plurality of mounting features.

8. The LED module according to claim 1, wherein the at least one LED is a wavelength converting material remote from a light source that activates the wavelength converting material.

9. The LED module according to claim 1, wherein the at least one LED is at least one light-emitting diode.

10. The LED module according to claim 1, wherein the thermally insulating material is a strip of thermally insulating material over a top surface of the plurality of mounting features.

11. A vehicle headlight comprising:
a heatsink module;
at least one LED on a top surface of the heatsink module; and
a plurality of mounting features protruding from the top surface of the heat sink module; and
an optical component mounted to the heatsink module via the plurality of mounting features and spaced apart from the plurality of mounting features such that they do not touch.

12. The vehicle headlight of claim 11, the plurality of mounting features have sharp edges.

13. The vehicle headlight of claim 12, wherein the plurality of mounting features have triangular shaped cross-sections.

14. The vehicle headlight of claim 11, wherein contact faces of the plurality of mounting features comprise protrusions.

15. The vehicle headlight of claim 11, wherein the plurality of mounting features comprise at least one through hole that is sufficiently larger than a corresponding lateral extension of a reflector pin to avoid contact between a heatsink of the heatsink module and the reflector pin in an area where the reflector pin penetrates the through hole.

* * * * *